(12) United States Patent
Tu et al.

(10) Patent No.: US 8,012,866 B2
(45) Date of Patent: Sep. 6, 2011

(54) METHOD OF BONDING SEMICONDUCTOR DEVICES UTILIZING SOLDER BALLS

(75) Inventors: Ping Liang Tu, Hong Kong (CN); Chun Hung Samuel Ip, Hong Kong (CN)

(73) Assignee: ASM Assembly Automation Ltd, Hong Kong (HK)

( * ) Notice: Subject to any disclaimer, the term of this patent is extended or adjusted under 35 U.S.C. 154(b) by 589 days.

(21) Appl. No.: 12/130,386

(22) Filed: May 30, 2008

(65) Prior Publication Data

US 2009/0298278 A1    Dec. 3, 2009

(51) Int. Cl.
*H01L 21/44*   (2006.01)

(52) U.S. Cl. ........ 438/616; 438/613; 438/614; 438/615; 438/118; 438/406; 257/E21.295; 257/E21.088

(58) Field of Classification Search .......... 257/E21.122–E21.128, E21.48, 257/E21.512, E21.519, E21.567–E21.57, E21.087–E21.088; 438/118, 406, 455–459, 615–617

See application file for complete search history.

(56) References Cited

U.S. PATENT DOCUMENTS

| 4,694,990 | A * | 9/1987 | Karlsson et al. ............. 239/81 |
| 6,533,159 | B1 * | 3/2003 | Cobbley et al. ............. 228/20.1 |
| 2005/0036902 | A1 * | 2/2005 | Amagai et al. ............. 420/557 |

* cited by examiner

*Primary Examiner* — N Drew Richards
*Assistant Examiner* — Mamadou Diallo
(74) *Attorney, Agent, or Firm* — Ostrolenk Faber LLP

(57) ABSTRACT

A method for bonding a semiconductor device onto a substrate is provided which comprises the steps of picking up a solder ball with a pick head, placing the solder ball onto the substrate and melting the solder ball on the substrate and placing the semiconductor device on the molten solder ball. The molten solder ball is then allowed to cool to form a solder joint which bonds the semiconductor device to the substrate.

19 Claims, 5 Drawing Sheets

METHOD OF BONDING SEMICONDUCTOR DEVICES UTILIZING SOLDER BALLS

FIELD OF THE INVENTION

The invention relates to the bonding of semiconductor chips or dice to carriers or substrates, such as bonding a Light-Emitting Diode ("LED") die to a substrate.

BACKGROUND AND PRIOR ART

Current bonding methods utilized for bonding LED devices, in particular high-power LED ("HP-LED") devices, comprise approaches such as gold-tin eutectic direct die bonding and silver epoxy bonding. Conventional LED bonding often employs gold-tin eutectic bonding. About 1-2 µm of a 20% gold-tin eutectic layer is attached on the backside of a die, and it is used to bond an LED device on a substrate, for example, a ceramic or organic substrate with a metallization pad, or a lead frame. The process includes preheating the substrate to 300-310° C. in an ambient chamber with shielding gas, after which the LED die is picked and placed onto the heated substrate. The gold-tin eutectic layer will melt and wet on the bond pad on the substrate. Hence, the LED die is bonded onto the substrate by way of the gold-tin eutectic solder material.

However, along with LED power increases, the LED size has been enlarged from as small as 10 square mils to as large as 40 square mils. With this development, it is often a challenge to apply the eutectic bonding method to HP-LED bonding as it would produce large no-bonding portions or voids on the bonding interface, and the bonding outcome is unstable. As a result, large voids occur frequently in the bond area for gold-tin eutectic bonds. Bonding performance is further unstable due to the large die size and thin solder layer (of 1-2 µm). Bonding strength and shear force thus obtained from gold-tin eutectic die bonding frequently fail to meet the required bond specification for HP-LED. It is also expensive.

Another universally-applied conventional LED bonding method uses epoxy bonding. It involves dispensing epoxy with or without silver particles onto a substrate first, and then placing the LED die onto an epoxy dome formed from the dispensed epoxy. Post curing is then carried out in an oven to cure and solidify the bond with the adhered LED die. However, the method is not suitable for application to HP-LED bonding. With higher power, it has become increasingly necessary to get rid of the heat generated during use more efficiently, such that HP-LED packages have become more complex to adapt them for heat dissipation. The inherent low thermal conductivity of the epoxy compound generally cannot meet the requirement of HP-LEDs. It would result in high thermal resistance at the bonding interface and decrease the emission efficiency of the LED. Although heavy silver epoxy is being developed to improve the thermal conductivity thereof, it is difficult to use the technique with current technology to bond LEDs requiring high power, due to process issues such as formation of dispensing tails, difficulty in controlling the volume dispensed, and epoxy overflow on top of the LED if too much epoxy is dispensed. These process issues would result in the lack of bonding coverage, LED shorting, die tilting and other problems.

Due to the aforesaid shortcomings of conventional eutectic and epoxy die bonding, soft solder may be used instead for the packaging of high power electronic devices. Generally, solder wire is used by a wire feed dispenser, and it can be used to bond large dice (having die sizes of larger than 40 mils) with a bond line thickness of 1 mil to 3 mils. An additional spanking process is then employed to spread the dispensed soft solder uniformly. For power LEDs, solder volume control is important for meeting bonding requirements for thin bond line thicknesses so that there is no tilting and in order that the positioning can be precise. However, the solder dot placement position typically varies in the said solder wire dispensing process due to the non-uniform shape of the tip of the solder wire, wire deformation and random wetting on the pad. Clearly, the existing solder wire feeding and dispensing process has to be further improved for HP-LED bonding.

Solder balls have been widely applied to solder bumping for BGA devices, CSP devices, flip chip devices and other similar devices. Solder balls are picked up by vacuum suction for placing them onto the bumping pads of substrates or printed circuit boards ("PCBs"). The solder bumping apparatus includes suction holes for holding the solder balls, and a suction mechanism for generating negative pressure to perform vacuum suction. In BGA ball bumping processes, the pickup head has a bottom face formed with a large number of suction holes for vacuum-absorbing a plurality of solder balls from a container. The pickup head is moved into a solder ball container to absorb solder balls by applying negative pressure at its suction holes. A vibration mechanism is sometimes applied to remove extra balls around the pick tip of the solder bumping apparatus, or cause the solder balls to drop from the bottom face of the pickup head. Moreover, light is sometimes irradiated along at least one side of the bottom of the pickup head, so that the presence of a solder ball mounting face, or the absence thereof indicating a pickup error, can be determined.

The flux can be pre-printed or coated on the substrate or PCB, or by dipping the substrate or PCB in a flux solution. After the solder balls have been placed on the substrate or PCB pads with solder flux, a post reflow process is used to fuse and form the required solder bumps in a reflow oven or by utilizing a laser beam. In conventional solder ball processes, soldering flux is employed on the substrate or PCB pad to stick the solder balls to the respective surface during solder ball placement. The application of flux or other adhesive agents is undesirable since it involves an additional process step and has the disadvantage of low thermal conductivity.

SUMMARY OF THE INVENTION

It is thus an object of the invention to seek to provide an improved die bonding method which avoids at least some of the aforesaid disadvantages of the prior art.

According to a first aspect of the invention, there is provided a method for bonding a semiconductor device onto a substrate, comprising the steps of: picking up a solder ball with a pick head; placing the solder ball onto the substrate; melting the solder ball on the substrate; and thereafter placing the semiconductor device on the molten solder ball; and thereafter cooling the molten solder to form a solder joint to bond the semiconductor device to the substrate.

According to a second aspect of the invention, there is provided a method for bonding a high-power LED chip onto a substrate, comprising the steps of: picking up a solder ball with a pick head; placing the solder ball onto the substrate; melting the solder ball on the substrate; and thereafter placing the high-power LED chip on the molten solder ball; and thereafter cooling the molten solder ball to form a solder joint to bond the high-power LED chip to the substrate.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of one preferred embodiment of the invention when considered with the accompanying drawings, in which.

DETAILED DESCRIPTION OF THE PREFERRED EMBODIMENT OF THE INVENTION

A preferred embodiment of the invention will hereinafter be described with reference to the accompanying drawings.

Figure 1:
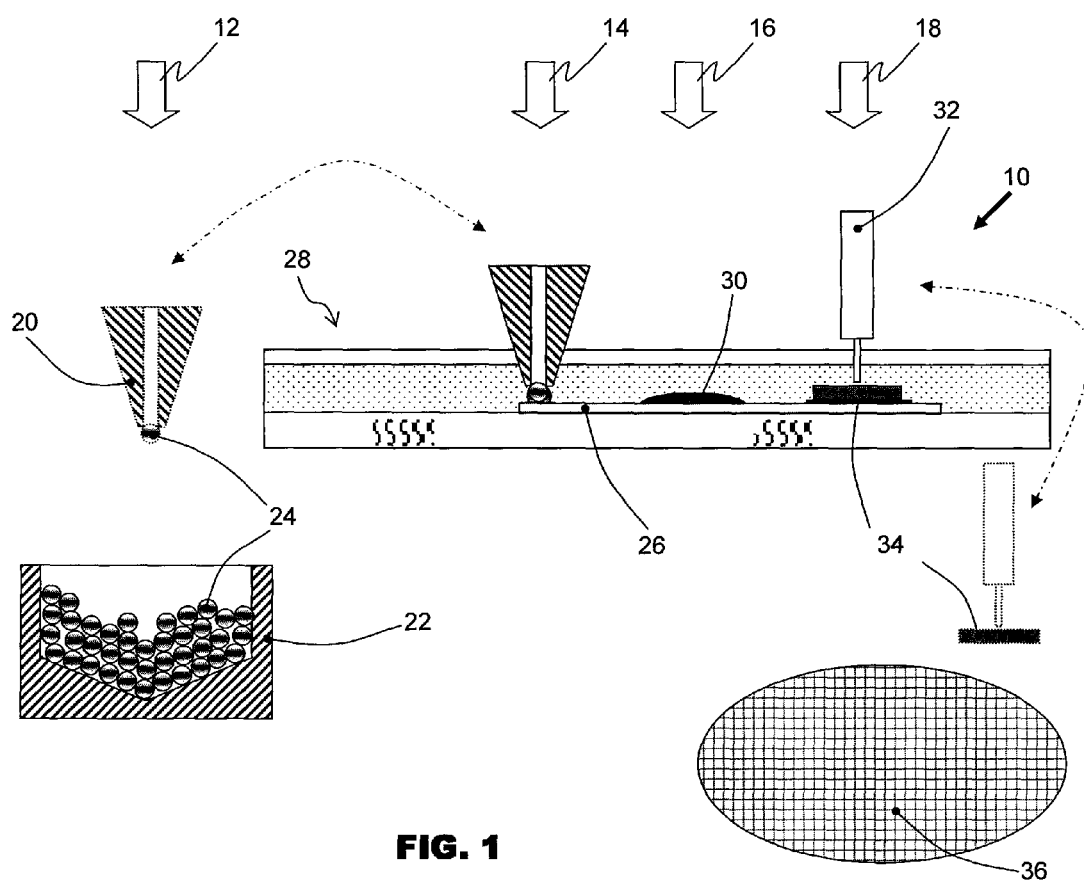
FIG. 1 is a schematic representation of a solder ball die bonding system according to the preferred embodiment of the invention.

FIG. 1 is a schematic representation of a solder ball die bonding system 10 according to the preferred embodiment of the invention. The use of a solder ball 24 to bond a semiconductor device, such as a high-power LED ("HP-LED") chip 34, is shown. The bonding process can be described in brief as follows: (i) picking up a solder ball 24 with the tip of a suction pick head 20 from a solder ball container 22 (station 12); (ii) placing the solder ball 24 onto a heated substrate 26 without the use of flux or other adhesive (station 14); (iii) melting the solder ball to form a solder dome 30 in the heat tunnel 28 in the presence of nitrogen/hydrogen forming gas (station 16); and (iv) picking an LED chip 34 from a wafer table 36 and bonding it onto the molten solder dome 30 with a bond arm 32 to form a solder joint to bond the HP-LED chip 34 to the substrate 26 (station 18).

Figure 2:
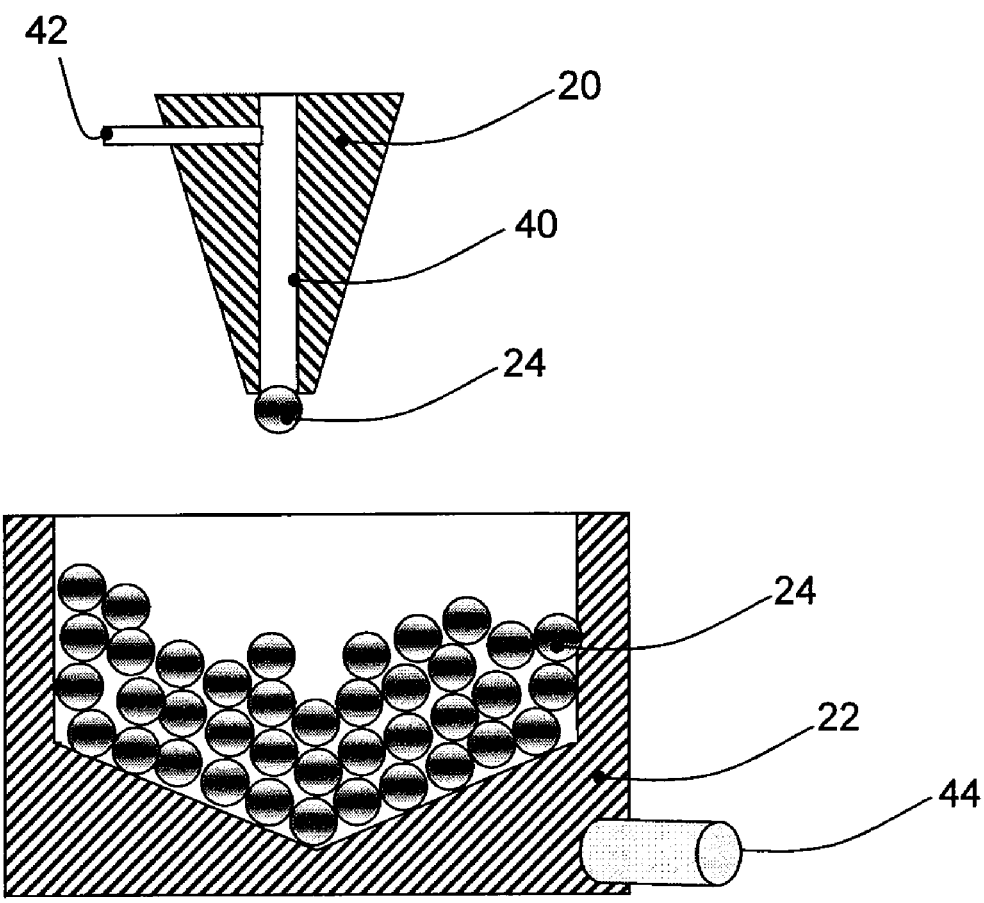
FIG. 2 is a side view of a suction pick head assembly having a single suction hole for picking up a solder ball from a solder ball container.

FIG. 2 is a side view of a suction pick head assembly 20 having a single vacuum suction hole 40 for picking up the solder ball 24 from a solder ball container 22. A vacuum system having a flow sensor 42 is used to maintain a negative pressure in the suction hole 40. The diameter of the suction hole 40 is less than the diameter of the solder ball 24. A smooth chamfer at the edge of the suction hole 24 is preferred for increasing the accuracy of ball placement. A number of solder balls 24 with a suitable diameter corresponding to the LED die 34 size is filled in the solder ball container 22 which stores a plurality of solder balls 24. The solder material can be a lead-tin system solder, or it can be also a tin, indium or gold-based alloy, also called herein lead-free solder. The preferred solder alloys are SnAg, SnSbAgCu or SnAgCu lead-free solder, and a ball diameter of 0.2-0.76 mm may typically be used for HP-LED bonding.

The suction pick head 20 is moved to the solder ball container 22, and lowered into a solder ball spool containing multiple solder balls 24. The driven depth should be several times of the defined ball diameter, and a 0-50 ms delay of the suction pick tip 20 in the solder ball spool is preferred for the pick-up process. Often, the driven depth is controlled to about 1-3 mm. A solder ball 24 is absorbed at the distal end of the tip of the suction pick head 20 by vacuum at the suction hole 40. An ultrasonic vibration source, preferably an ultrasonic vibrator 44, may be incorporated on the solder ball container 22 for directly applying ultrasonic vibration to the solder spool. The flow sensor 42 which is installed and connected to the suction hole 40 of the suction pick head 20 helps to monitor the pressure in the suction hole 40 in real time. Furthermore, the presence of a solder ball being absorbed at the suction hole 40, or the absence thereof indicating a solder ball pickup error, can be determined according to the pressure indication.

Figure 3:
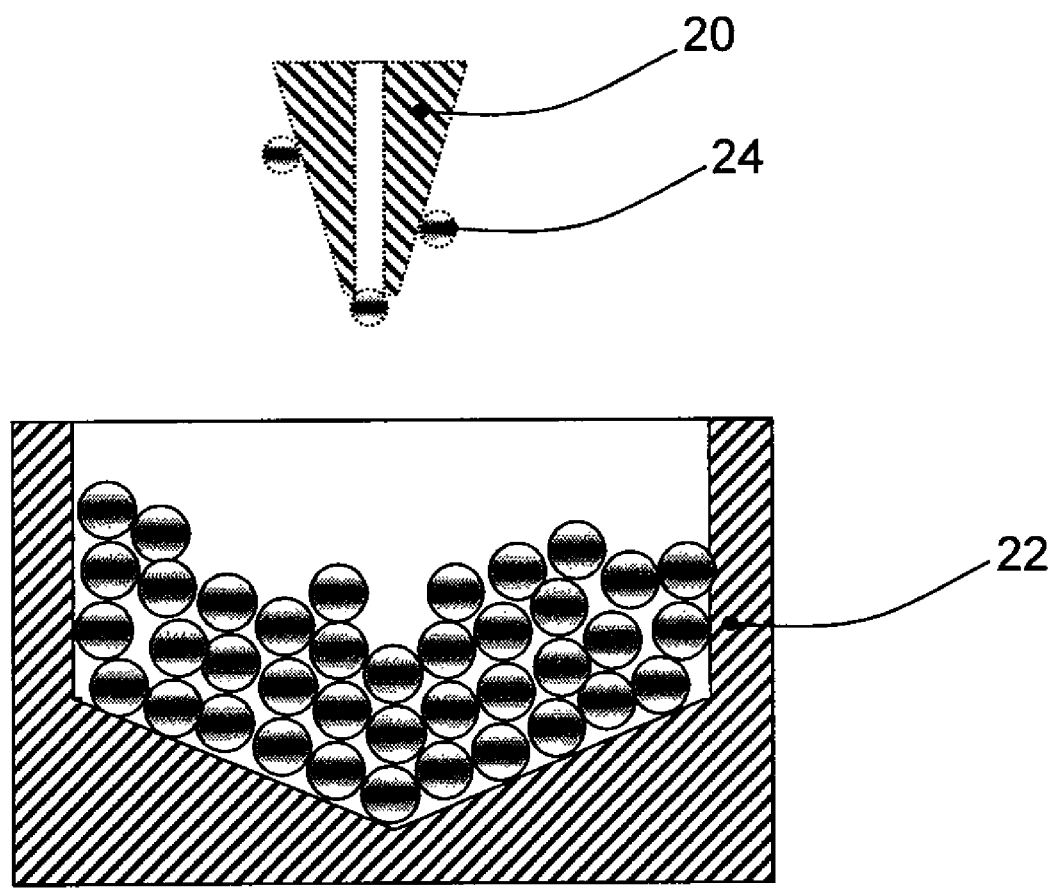
FIG. 3 illustrates excess solder balls adhering to the suction pick head assembly.

FIG. 3 illustrates excess solder balls 24 adhering to the suction pick head assembly 20. The application of ultrasonic vibration helps to prevent excess balls 24 from adhering to the suction pick head 20 during the solder ball pick-and-place operation, and it is also used to enhance the absorption of the solder ball 24 held at the distal end of suction hole 40. Released solder balls 24 fall back into the solder ball container 22.

Figure 4:
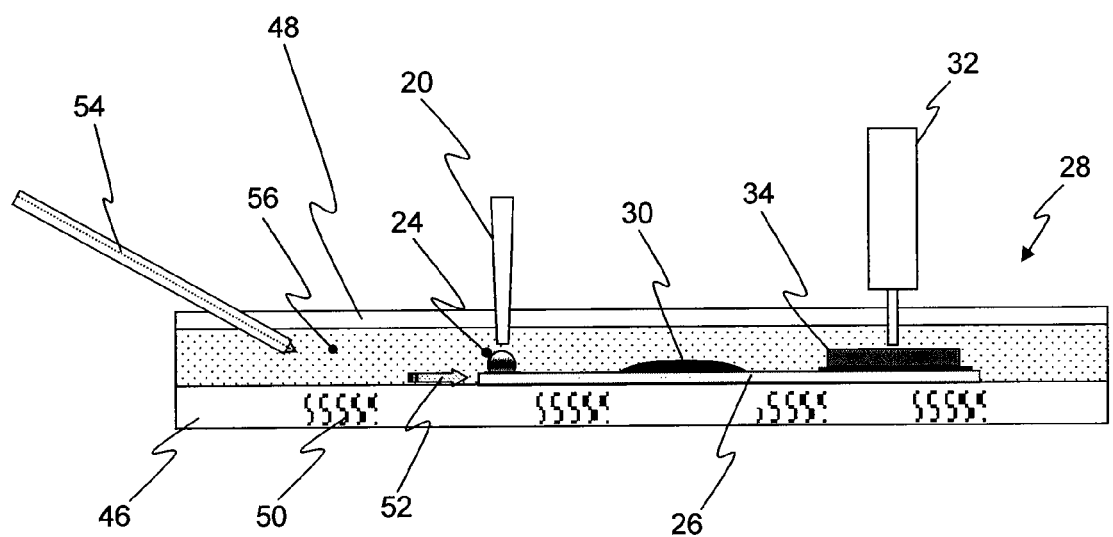
FIG. 4 is a side view of a heat tunnel assembly showing the solder ball die bonding process according to the preferred embodiment of the invention.

FIG. 4 is a side view of a heat tunnel assembly 28 showing the solder ball die bonding process according to the preferred embodiment of the invention. The steps of placing the solder ball 24 onto the substrate 26, melting the solder ball 24 on the substrate 26 and placing the HP-LED chip 34 on the melted solder ball are preferably all carried out when the substrate 26 is substantially enclosed in the heat tunnel assembly 28. The substrate 26 or leadframe carrier is indexed to a first position, which may be a solder ball placing position 14, by the indexer 52 and is preheated in the heat tunnel 28 up to a predetermined temperature that is higher than the melting point of the solder ball 24 used.

Following the pick-up process, the suction pick head 20 carrying the solder ball 24 moves to the heat tunnel 28 by means of motion control system (not shown) for ball placement. The heat-tunnel 28 comprises a heater block 46 used to support substrates 26, a cover 48 for maintaining a forming gas ambient in the chamber, heaters 50 for heating the substrate 26 during solder ball bonding, and an indexer 52. A tube 54 is connected into the heat tunnel 28 to supply nitrogen/hydrogen forming gas 56. The nitrogen/hydrogen forming gas 56 is a typical example of the shielding gas that can be used, and the invention is not limited to the use of this gas only. The shielding gas can also be nitrogen gas, reducing gas or any inert gas. The forming gas 56 fills the whole chamber of the heat tunnel 28 to protect the substrate 26 and solder balls 24 from oxidation. The oxygen level therein is preferably controlled to below 500 ppm by the forming gas 56 in the heat tunnel 28.

The substrate 26 has bond pad(s) comprising gold, silver or nickel plating on a matrix material, or bare copper metal, for LED bonding. No flux or paste is required to be added onto the substrate pad(s) prior to bonding. The attached solder ball 24 at the distal end of the suction pick head 20 is brought into the chamber of the heat tunnel 28 with forming gas 56, and is then positioned over the substrate pad. Thereafter, the absorbed ball is released from the suction pick head 20 and dropped onto the substrate pad 26. The dispensing distance between the distal end of the suction pick head 20 and pad surface should be controlled. The distance is often controlled within a range of 0-0.5 mm; a preferred placing height of 0.03 mm is used in the present process. The release of the solder ball 24 may be by means of switching off the vacuum and blowing a puff of gas into the suction hole 40. Accordingly, the solder ball 24 is placed onto the substrate 26 in the heat tunnel with forming gas 56, and is pre-bonded by the solder ball 24 partly melting at the ball underbody since the substrate 26 has been heated above the melting point of the solder.

The bond placement of the solder ball 24 depends on the place height, blow rate and motion control. Having a placement height that is too high, a weak blow rate and/or a low pre-heat temperature for the substrate 26 will result in poor ball placement, or it would be difficult to release the ball from the suction pick head 20. It is necessary to control the displacement with less than plus or minus 1 mil for LED bonding. The preheat temperature of the substrate 26 is preferably set at a temperature that is between a solder melting point and plus 30° C. The more preferred temperature in the present process is the solder melting point plus 10° C. The pressure in the suction hole 40 is monitored to determine the presence of a solder-ball placement error according to the pressure indication. When the solder ball 24 is absorbed at the distal end of the pick head's suction hole 40, the pressure in the suction hole 40 is low since the air in the suction hole 40 is pumped out by a vacuum system. After the solder ball 24 is placed onto the substrate 26, air will leak into the suction hole 40 so that the pressure in the hole 40 is high. Accordingly, a defined pressure can be specified to correspond to the status of whether the solder ball 24 remains attached to the bottom of the pick tip 20 or not. Hence, the presence or absence of a solder ball placing error can be determined.

After solder ball placement, the suction pick head 20 goes back to the solder ball container 22 for the next solder ball pick-and-place operation. The pre-bonded solder ball 24 on the substrate 26 is moved together with the substrate 26 to a second position, which may be an LED die bond position, by the indexer 52. In the meantime, the pre-bonded solder ball will be heated up to melt and wet the substrate pad comprising gold, silver or nickel plating, or bare copper. A solder dome 30 is formed during the motion from the solder ball placement station 14 to the die bond station 18. A substantially flat dome shape with a low height is especially helpful for power LED bonding, and it can be achieved on gold or silver plating under a forming gas 56 ambient and at a high bonding temperature. Here, the oxygen level is controlled to below 100 ppm by the forming gas flow and the bond temperature is at solder melt point plus 30-50° C. No flux is required in the present process. Thereafter, a bond-arm 32 is used to pick up a HP-LED chip 34 from a wafer table 36 and to bond the LED chip 34 onto the solder dome 30 on the substrate 26. The substrate 26 with the bonded LED chip 34 is held in the heat tunnel 28 containing shielding gas for a predetermined time, and then is moved to a low temperature area for cooling. Since the solder ball 24 material is used to bond the HP-LED chip 34 to the substrate 26, the solder joint covers a majority of a surface area of the HP-LED chip 34 to enhance the strength of the bond.

While an exemplary embodiment for the single solder ball LED die bonding has been described above and shown in the accompanying drawings, it is to be understood that such an embodiment is merely illustrative of and not restricted to single solder ball bonding of HP-LED dice. The present invention is also applicable to the bonding of a semiconductor or HP-LED submount on a substrate or heat-sink using multiple solder balls simultaneously.

Figure 5:
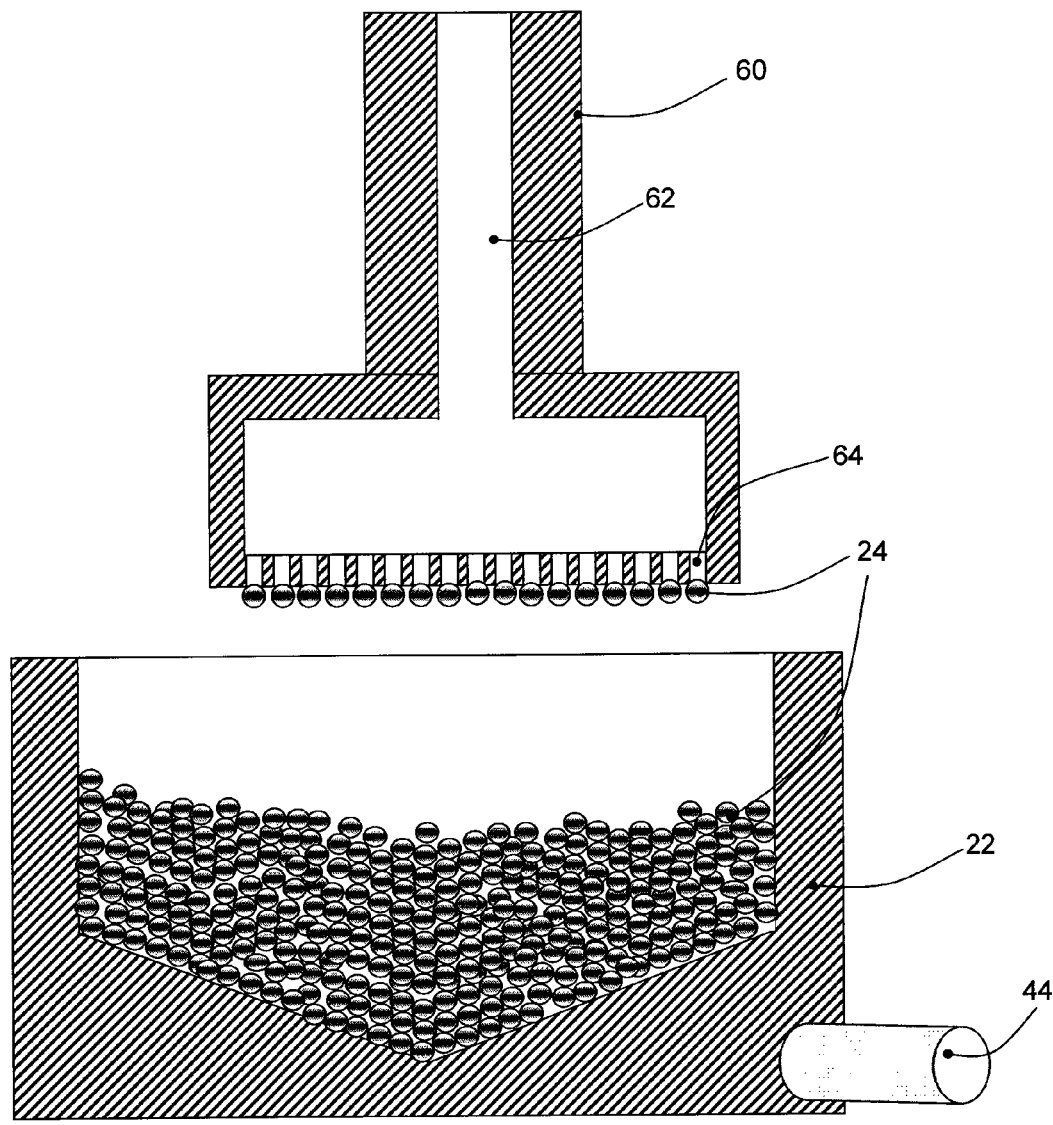
FIG. 5 is a side view of a suction pick head assembly having a plurality of suction holes for picking up an array of solder balls from a solder ball container.

FIG. 5 is a side view of a suction pick head assembly 60 having a plurality of suction holes 64 for picking up an array of solder balls 24 from a solder ball container 22 simultaneously. In this multiple solder ball pick system, the suction pick head 60 with a matrix of suction holes 64 on its bottom face is used to replace the suction pick head 20 with a single suction hole 40 described above. The matrix of suction holes 64 is fluidly connected to a vacuum hole 62. The arrangement of the matrix of suction holes 64 corresponds to the LED submount geometry to be bonded, and the solder-ball pitch is preferably designed to be about 2 times larger than that of the used solder ball diameter for a gold or sliver coated substrate pad, or about 1.5 times larger than that of the used solder ball diameter for a bare copper substrate. In the ball-picking process, the suction pick head 60 is moved over the solder ball container 22, and then is lowered into the ball spool containing multiple solder balls 24. A number of solder balls 24 are held matrixwise at the same time on the pick head 60 bottom by the matrix of suction holes 64. Thereafter, the suction head 60 is moved to the ball placement position in the heat tunnel 28. A puff of gas is utilized to release and place the solder balls 24 onto the pre-heated substrate 26, lead frame or heat-sink without flux. Hence, the solder balls 24 are grid-arranged, similar to the ball grid arrangement on the suction pick head 60, onto bond pads of the substrate 26, lead frame or heat sink.

Then the solder balls 24 will be melted and wetted in an ambient of forming gas 56 in order to form a solder pattern corresponding to the submount geometry. Thereafter, the submount or LED chip 34 is bonded onto the solder ball pattern by a bond arm 32. A solder bond thus formed has very little, if any, die tilt or void, and has almost full coverage of the bonding area.

The solder ball die bonding methods described herein can be advantageously applied to HP-LED die bonds in particular to meet demanding HP-LED requirements regarding thermal conductivity and reliable bonding processes. It can be used to replace the existing die bonding methods in order to avoid the need for gold-tin eutectic direct bonding or bumping for flip chip bonding on the backside of the die. The solder ball die bond can also be used to avoid the dispensing difficulties and die tilting issues of heavy silver epoxy bonding. Overflow of silver epoxy compound on top of the LED chip is also avoided by the present method.

Application of the preferred embodiments of the invention to HP-LED bonding is beneficial to improve the thermal conduction of the bonding layer, thereby reducing thermal resistance at the interface between LED die with substrate. It enhances bond quality with reduced or no voids, full bond coverage and process variability of the bond line thickness. Another advantage is that the described method can be applied for bonding LED chips to substrates with rough surface finishes.

The method also increases bonding capability and productivity (UPH) and reduces production costs for die bonding, since there is no need for the application of flux or other adhesive agent. It would be appreciated that the bond line thickness can be easily varied by changing the solder ball size. Moreover, accuracy of solder volume control and dispensing placement is improved. Ultimately, the above solder ball die bonding processes can be simple, cheap and more reliable comparative to the aforesaid prior art.

The invention described herein is not limited to the HP-LED bonding as shown and described above, since various other power devices can be also bonded using the solder ball die bonding process which is described above. The invention is susceptible to variations, modifications and/or additions other than those specifically described and it is to be understood that the invention includes all such variations, modifications and/or additions which fall within the spirit and scope of the above description.

The invention claimed is:

1. Method for bonding a semiconductor device onto a substrate, comprising the steps of:
   picking up a solder ball with a pick head;
   placing the solder ball onto the substrate;
   melting the solder ball on the substrate;
   placing the semiconductor device on the molten solder ball; and thereafter cooling the molten solder ball to form a solder joint to bond the semiconductor device to the substrate; and heating the substrate to a predetermined temperature which is higher than a melting point of the solder ball before the step of placing the solder ball onto the substrate.

2. Method as claimed in claim 1, wherein the predetermined temperature of the substrate is between the melting point of the solder ball and plus 30° C.

3. Method as claimed in claim 2, wherein the predetermined temperature of the substrate is between the melting point of the solder ball and plus 10° C.

4. Method as claimed in claim 1, further comprising the step of melting the solder ball into a substantially flat dome shape prior to placing the semiconductor device on the solder ball.

5. Method as claimed in claim 1, wherein the steps of placing the solder ball onto the substrate, melting the solder ball on the substrate and placing the semiconductor device on the melted solder ball are all carried out when the substrate is substantially enclosed in a heat tunnel.

6. Method as claimed in claim 5, further comprising the step of indexing the substrate from a first position where the solder ball is placed onto the substrate to a second position where the semiconductor device is placed onto the solder ball.

7. Method as claimed in claim 5, further comprising the step of introducing a shielding gas comprising an inert gas into the heat tunnel to protect the substrate and the solder ball from oxidation.

8. Method as claimed in claim 1, wherein the pick head includes a vacuum suction hole.

9. Method as claimed in claim 8, wherein the pick head comprises a single vacuum suction hole with a diameter which is smaller than a diameter of the solder ball.

10. Method as claimed in claim 8, wherein the pick head comprises a plurality of suction holes to pick up and place a plurality of solder balls simultaneously, each suction hole having a diameter which is smaller than a diameter of each solder ball.

11. Method as claimed in claim 10, wherein the semiconductor device comprises a semiconductor submount.

12. Method as claimed in claim 8, further comprising the step of sensing a pressure flow at the pick head to determine whether a solder ball is being absorbed at the vacuum suction hole of the pick head during the pick-up and placement of a solder ball.

13. Method as claimed in claim 1, wherein the solder ball is picked up from a solder ball container for storing a plurality of solder balls.

14. Method as claimed in claim 13, wherein the pick head is driven into the solder ball container at a depth of 1 to 3 mm to pick up a solder ball.

15. Method as claimed in claim 1, wherein the solder joint covers a majority of a surface area of the semiconductor device.

16. Method as claimed in claim 1, wherein the solder ball is made from a material comprising a lead-tin solder, tin, indium or gold-based alloy.

17. Method as claimed in claim 16, wherein the solder ball is made from a material selected from the group consisting of: SnAg, SnSbAgCn and SnAgCn.

18. Method as claimed in claim 1, wherein the solder ball is bonded onto the substrate without the use of an adhesive compound.

19. Method for bonding a high-power LED chip onto a substrate, comprising the steps of:

picking up a solder ball with a pick head;
placing the solder ball onto the substrate;
melting the solder ball on the substrate;
placing the high-power LED chip on the molten solder ball; and thereafter
cooling the molten solder ball to form a solder joint to bond the high-power LED chip to the substrate; and
heating the substrate to a predetermined temperature which is higher than a melting point of the solder ball before the step of placing the solder ball onto the substrate.

* * * * *